United States Patent
Hsieh et al.

(10) Patent No.: US 10,594,264 B2
(45) Date of Patent: Mar. 17, 2020

(54) DYNAMIC AMPLIFIER AND RELATED GAIN BOOSTING METHOD

(71) Applicant: NOVATEK Microelectronics Corp., Hsin-Chu (TW)

(72) Inventors: Cheng-En Hsieh, Kaohsiung (TW); Shen-Iuan Liu, Taipei (TW); Tzu-Chien Tzeng, Hsinchu (TW); Jin-Yi Lin, Kaohsiung (TW); Kuo-Sheng Huang, Hsinchu (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 21 days.

(21) Appl. No.: 16/021,032

(22) Filed: Jun. 28, 2018

(65) Prior Publication Data
US 2020/0007085 A1    Jan. 2, 2020

(51) Int. Cl.
| | | |
|---|---|---|
| *H03G 3/10* | (2006.01) | |
| *H03F 1/02* | (2006.01) | |
| *H03F 3/00* | (2006.01) | |
| *H03F 3/45* | (2006.01) | |
| *H03G 1/00* | (2006.01) | |
| *H03K 19/0185* | (2006.01) | |

(52) U.S. Cl.
CPC ........... *H03F 1/0211* (2013.01); *H03F 3/005* (2013.01); *H03F 3/45179* (2013.01); *H03F 3/45475* (2013.01); *H03G 1/007* (2013.01); *H03F 2203/45288* (2013.01); *H03K 19/018585* (2013.01)

(58) Field of Classification Search
CPC .............. H03F 1/0211; H03F 3/45179; H03F 3/45475; H03F 3/005; H03F 2203/45288; H03F 3/217; H03F 3/2173; H03F 3/2171; H03F 3/45183; H03G 1/007; H03G 1/0023; H03G 1/0088; H03G 3/3042; H03K 19/018585
USPC ................................. 330/250, 251, 254, 278
See application file for complete search history.

(56) References Cited

U.S. PATENT DOCUMENTS

| | | | |
|---|---|---|---|
| 6,392,475 B1 * | 5/2002 | Lee | H03F 3/005 327/124 |
| 8,324,968 B2 * | 12/2012 | Honda | H03F 3/45183 330/258 |

OTHER PUBLICATIONS

J. Lin, M. Miyahara, and A. Matsuzawa, "A 15.5dB, wide signal swing, dynamic amplifier using a common-mode voltage detection technique," IEEE Int. Symp. Circuits Syst., May 2011, pp. 21-24.

(Continued)

*Primary Examiner* — Khanh V Nguyen
(74) *Attorney, Agent, or Firm* — Winston Hsu

(57) ABSTRACT

A dynamic amplifier includes a first output capacitor, a first switch, a current source, a second switch, a voltage detector, a third switch and a level shifter. The first switch is coupled between a first terminal of the first output capacitor and a voltage detection node. The second switch is coupled to the current source and the voltage detection node. The voltage detector is coupled to the voltage detection node and the first switch. The third switch is coupled between the voltage detection node and a power source. The level shifter is coupled to a second terminal of the first output capacitor.

19 Claims, 15 Drawing Sheets

(56) References Cited

OTHER PUBLICATIONS

F. van der Goes, C. Ward, S. Astgimath, H. Yan, J. Riley, J. Mulder, S. Wang, and K. Bult, "A 1.5mW 68dB-SNDR 80MS/s 2-times interleaved SAR-assisted pipelined ADC in 28nm CMOS," IEEE Int. Solid-State Circuits Conf., Feb. 2014, pp. 200-201 and Figure 11.4.7.

B. Malki, B. Verbruggen, P. Wambacq, K. Deguchi, M. Iriguchi, J. Craninckx, "A complementary dynamic residue amplifier for a 67 dB SNDR 1.36 mW 170 MS/s pipelined SAR ADC," ESSCIRC Digest Technical Papers, pp. 215-218, Sep. 2014.

\* cited by examiner

DYNAMIC AMPLIFIER AND RELATED GAIN BOOSTING METHOD

BACKGROUND OF THE INVENTION

1. Field of the Invention

The present invention relates to a dynamic amplifier, and more particularly, to a gain boosting technique applicable to a dynamic amplifier.

2. Description of the Prior Art

A dynamic amplifier has been widely applied in various circuitries, such as an analog to digital converter (ADC), an integrator and an output buffer. Both a dynamic amplifier and a general operational amplifier provide a specific gain for amplifying input signals. The difference between the dynamic amplifier and the general operational amplifier is that, the general operational amplifier performs continuous-time operations while the dynamic amplifier performs discrete-time operations. Thus, the dynamic amplifier is applicable to a discrete-time circuit system such as a residue amplifier of a pipeline ADC and a discrete-time delta-sigma modulator (DSM) ADC.

The dynamic amplifier receives a differential pair of input signals, which generate differential currents for charging or discharging the output capacitors to amplify the input signals. A clock dynamically controls the amplifier to perform the amplification, as the name "dynamic amplifier" implies. In the dynamic amplifier, the gain A may be obtained as follows:

$$A = \frac{g_m}{I_d} \times \Delta V_{CM};$$

wherein $g_m$ equals the transconductance of the input differential pair of the amplifier, $I_d$ equals the current of the differential pair, and $\Delta V_{CM}$ is the variation of common-mode voltage of the output terminals which changes due to signal amplification. In addition, $\Delta V_{CM}$ may be obtained as follows:

$$\Delta V_{CM} = \frac{I_d \cdot T_{int}}{C};$$

wherein C is the capacitance value of the output capacitors, and $T_{int}$ is integrating time of the amplification.

In order to boost the gain A of the dynamic amplifier, the variation of common-mode voltage $\Delta V_{CM}$ may be increased by increasing the integrating time $T_{int}$. However, the variation of common-mode voltage $\Delta V_{CM}$ is limited under the power supply voltage $V_{DD}$ of the dynamic amplifier, which further limits the gain A.

In the prior art, gain boosting is realized by including additional capacitor pairs in the dynamic amplifier, where charging/discharging operations are implemented in two steps on different capacitors, allowing extension of the integrating time $T_{int}$. However, this implementation requires more capacitors such that the circuit cost may increase, and higher power consumption is required due to the increasing number of capacitors.

Thus, there is a need for improvement over the prior art.

SUMMARY OF THE INVENTION

It is therefore an objective of the present invention to provide a novel gain boosting technique for a dynamic amplifier, to realize higher gain and also prevent the above problems.

An embodiment of the present invention discloses a dynamic amplifier, which comprises a first output capacitor, a first switch, a current source, a second switch, a voltage detector, a third switch and a level shifter. The first switch is coupled between a first terminal of the first output capacitor and a voltage detection node. The second switch is coupled to the current source and the voltage detection node. The voltage detector is coupled to the voltage detection node and the first switch. The third switch is coupled between the voltage detection node and a power source. The level shifter is coupled to a second terminal of the first output capacitor.

Another embodiment of the present invention discloses a dynamic amplifier, which comprises a first output capacitor, a second output capacitor, a first cutoff switch, a second cutoff switch, a current source, an amplification control switch, a voltage detector, a first reset switch, a second reset switch, a coupling capacitor and a level shifter. The first cutoff switch is coupled between the first output capacitor and a first voltage detection node. The second cutoff switch is coupled between the second output capacitor and a second voltage detection node. The amplification control switch is coupled to the current source, the first voltage detection node and the second voltage detection node. The voltage detector is coupled to the first voltage detection node, the second voltage detection node, the first cutoff switch and the second cutoff switch. The first reset switch is coupled between the first voltage detection node and a power source. The second reset switch is coupled between the second voltage detection node and the power source. The level shifter is coupled to the voltage detector via the coupling capacitor.

Another embodiment of the present invention discloses a gain boosting method for a dynamic amplifier. The gain boosting method comprises resetting an output voltage of a first terminal of the output capacitor to a power supply voltage; charging or discharging the output capacitor with a charge or discharge current to perform amplification, to increase or decrease the output voltage; and shifting the output voltage by switching a second terminal of the output capacitor coupled to a first reference voltage node to be coupled to a second reference voltage node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
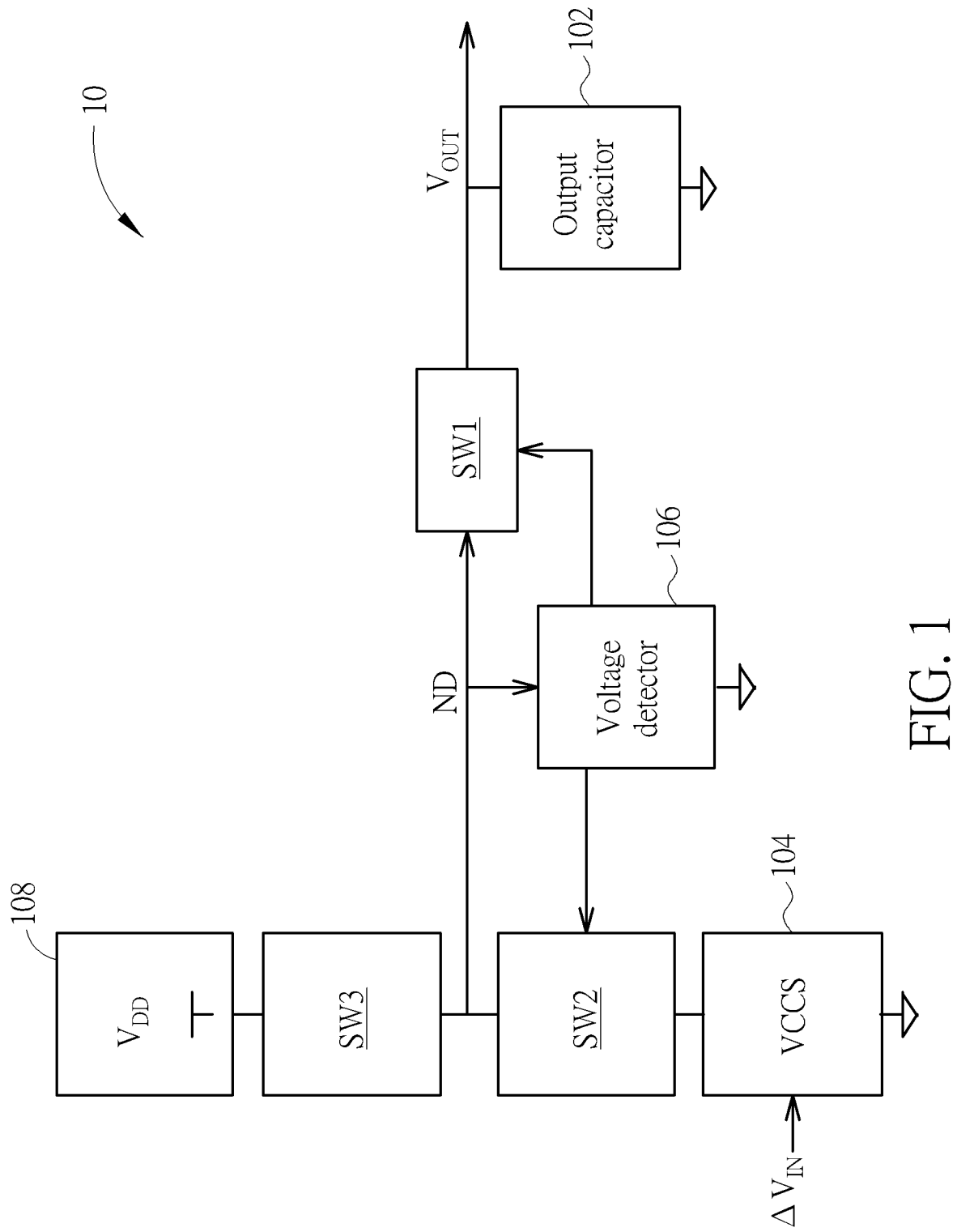
FIG. 1 is a schematic diagram of a general dynamic amplifier.

Please refer to FIG. 1, which is a schematic diagram of a general dynamic amplifier 10. As shown in FIG. 1, the dynamic amplifier 10 includes an output capacitor 102, a voltage-controlled current source (VCCS) 104, a voltage detector 106 and switches SW1-SW3. The dynamic amplifier 10 receives a power supply voltage $V_{DD}$ from a power source 108 which may or may not be included in the dynamic amplifier 10. The VCCS 104 is configured for charging or discharging the output capacitor 102 with a charge or discharge current based on a received input signal $\Delta V_{IN}$, to generate an output signal $V_{OUT}$ by amplifying the input signal $\Delta V_{IN}$. The voltage detector 106, coupled to a voltage detection node ND and the switches SW1 and SW2, is configured for detecting the output voltage of the output capacitor 102 via the voltage detection node ND, and thereby controlling the switches SW1 and/or SW2 to be turned on or off. The switch SW1, coupled between a terminal of the output capacitor 102 and the voltage detection node ND, acts as a cutoff switch that may cut off the signal path between the voltage detection node ND and the output capacitor 102 as controlled by the voltage detector 106. The switch SW2, coupled between the VCCS 104 and the voltage detection node ND, acts as an amplification control switch for controlling the VCCS 104 to start to output the charge or discharge current or to stop outputting the charge or discharge current. The switch SW3, coupled between the voltage detection node ND and the power source 108, acts as a reset switch for resetting the output voltage of the output capacitor 102 to the power supply voltage $V_{DD}$ when turned on.

Figure 2:
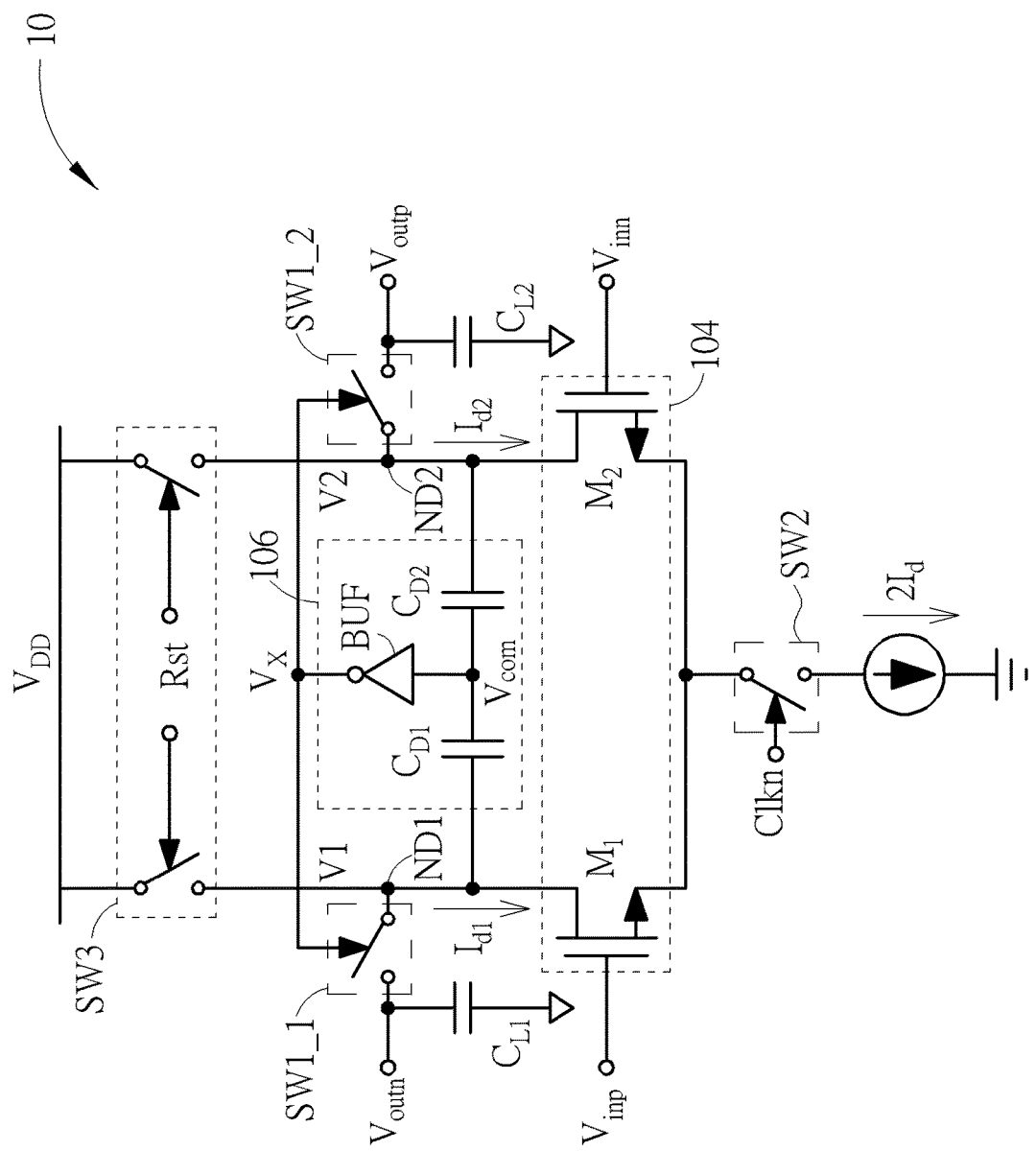
FIG. 2 illustrates an exemplary circuit structure of the dynamic amplifier shown in FIG. 1.

FIG. 2 illustrates an exemplary circuit structure of the dynamic amplifier 10 shown in FIG. 1. The output capacitor 102 is composed of two output capacitors $C_{L1}$ and $C_{L2}$ respectively disposed at the differential output terminals of the dynamic amplifier 10, and the output capacitors $C_{L1}$ and $C_{L2}$ are coupled to switches SW1_1 and SW1_2, respectively. The switches SW1_1 and SW1_2, as the components of the cutoff switch SW1, are controlled by the voltage detector 106. The VCCS 104 includes input transistors M1 and M2, which receive the differential input voltages $V_{inp}$ and $V_{inn}$ to generate currents $I_{d1}$ and $I_{d2}$. The amplification control switch SW2 is controlled by a clock signal Clkn. The reset switch SW3 is controlled by a reset signal Rst. The voltage detector 106 may detect the output voltage $V_{outn}$ of the output capacitor $C_{L1}$ by receiving the voltage V1 at a voltage detection node ND1, and detect the output voltage $V_{outp}$ of the output capacitor $C_{L2}$ by receiving the voltage V2 at a voltage detection node ND2.

Figure 3:
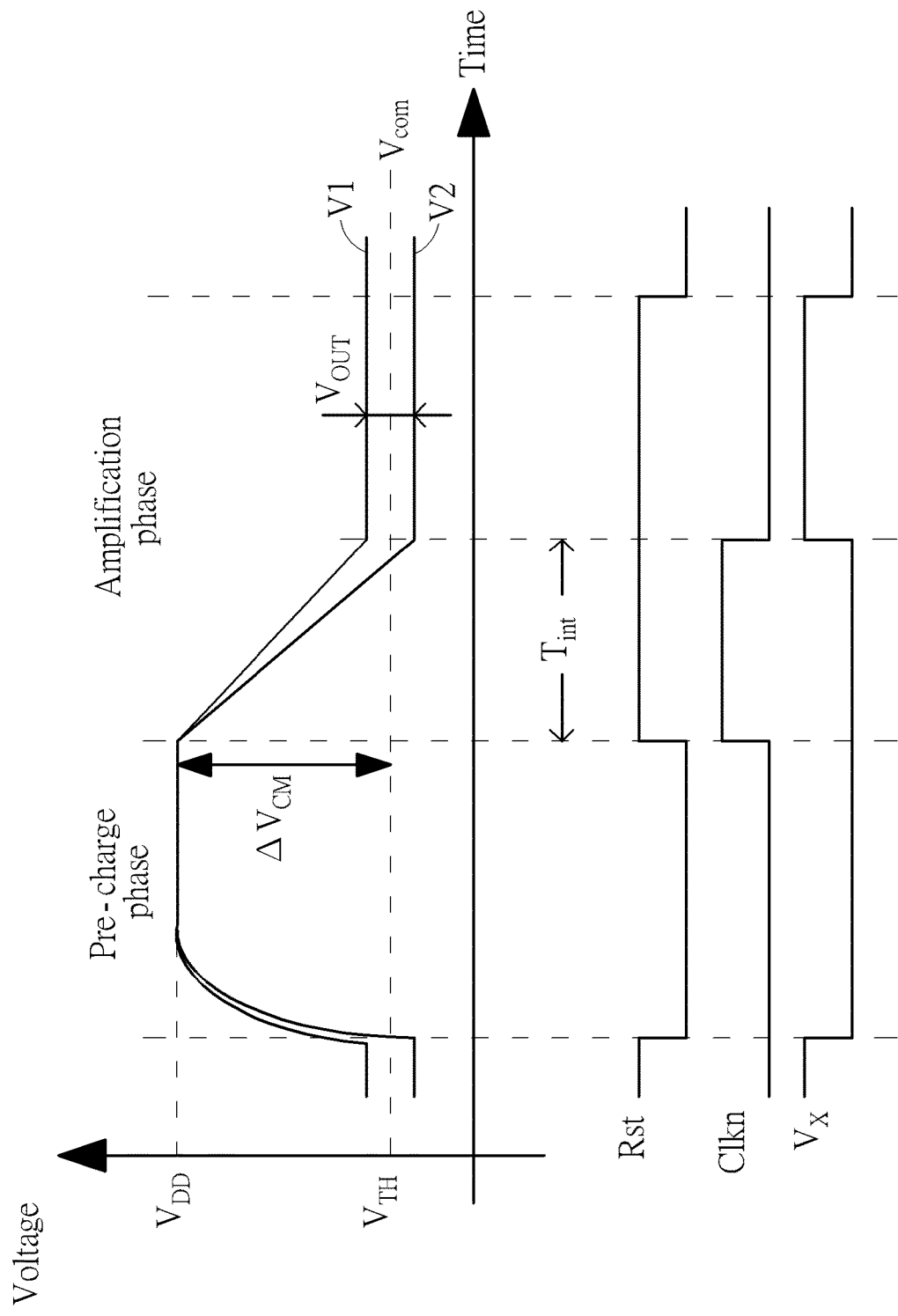
FIG. 3 illustrates detailed operations of the dynamic amplifier shown in FIG. 1.

FIG. 3 illustrates detailed operations of the dynamic amplifier 10. The operations may include a pre-charge phase and an amplification phase. In the pre-charge phase, the reset switch SW3 and the cutoff switch SW1 are turned on and the amplification control switch SW2 is turned off. More specifically, the reset signal Rst is in "Low" level to turn on the reset switch SW3 which may be implemented with PMOS transistors, and the clock signal Clkn is in "Low" level to turn off the amplification control switch SW2 which may be implemented with an NMOS transistor. The switches SW1_1 and SW1_2 are turned on by a control signal Vx from the voltage detector 106. In such a situation, the output capacitors $C_{L1}$ and $C_{L2}$ are charged by currents from the power source, and the output voltages $V_{outn}$ and $V_{outp}$ together with the voltages $V_1$ and $V_2$ at the voltage detection nodes ND1 and ND2 are reset to the power supply voltage $V_{DD}$, as shown in FIG. 3.

At the end of the pre-charge phase, the clock signal Clkn rises to "High" level, allowing the dynamic amplifier 10 to enter the amplification phase and start to perform signal amplification. In the amplification phase, the cutoff switch SW1 and the amplification control switch SW2 are turned on and the reset switch SW3 is turned off. More specifically, the clock signal Clkn is in "High" level to turn on the amplification control switch SW2, and the reset signal Rst is in "High" level to turn off the reset switch SW3. The switches SW1_1 and SW1_2 are still turned on by the control signal Vx from the voltage detector 106. In such a situation, the output capacitors $C_{L1}$ and $C_{L2}$ are discharged by currents $I_{d1}$ and $I_{d2}$ generated by the VCCS 104, and the output voltages $V_{outn}$ and $V_{outp}$ together with the voltages V1 and V2 at the voltage detection nodes ND1 and ND2 fall. The falling speed is determined by the magnitudes of the discharge currents $I_{d1}$ and $I_{d2}$. During the discharging process, the voltage detector 106 may detect the common-mode voltage $V_{com}$ of the output voltages $V_{outn}$ and $V_{outp}$ reaches a threshold $V_{TH}$. When detecting that the common-mode voltage $V_{com}$ reaches the threshold $V_H$, the voltage detector 106 turns off the switches SW1_1 and SW1_2 via the control signal Vx, and the amplification control switch SW2 may also be turned off, to stop the discharging operation.

Therefore, the input signal $\Delta V_{IN}$, which equals the difference between the input voltages $V_{inp}$ and $V_{inn}$, is converted into discharge currents $I_{d1}$ and $I_{d2}$ and thereby amplified to generate the output signal $V_{OUT}$, which equals the difference between the voltages V1 and V2 and also equals the difference between the output voltages $V_{outn}$ and $V_{outp}$ after the discharging process. In this case, the gain A of the dynamic amplifier 10 is obtained as follows:

$$A = \frac{V_{outp} - V_{outn}}{\Delta V_{IN}} = \frac{g_m}{I_d} \times \Delta V_{CM} = \frac{g_m}{I_d} \times (V_{DD} - V_{com});$$

wherein $g_m$ equals the transconductance of the input transistors M1 and M2, $I_d$ equals a half of the total current supplied to the VCCS 104, and $\Delta V_{CM}$ is the variation of common-mode voltage $V_{com}$ which falls from the power supply voltage $V_{DD}$ due to the discharging operation during signal amplification.

In order to enhance the gain A, a level shifter is applied to shift the output voltages $V_{outn}$ and $V_{outp}$ to a higher voltage, to increase the variation of common-mode voltage $\Delta V_{CM}$. Please refer to FIG. 4, which is a schematic diagram of a dynamic amplifier 40 according to an embodiment of the present invention. The structure of the dynamic amplifier 40 is similar to the structure of the dynamic amplifier 10 shown in FIG. 1, so elements or modules having the same functions are denoted by the same symbols. The difference between the dynamic amplifier 40 and the dynamic amplifier 10 is that, the dynamic amplifier 40 further includes a level shifter LS coupled to another terminal of the output capacitor 102. The level shifter LS may receive a shift control signal CS, which controls the output capacitor 102 to be coupled to different reference voltage nodes.

Figure 4:
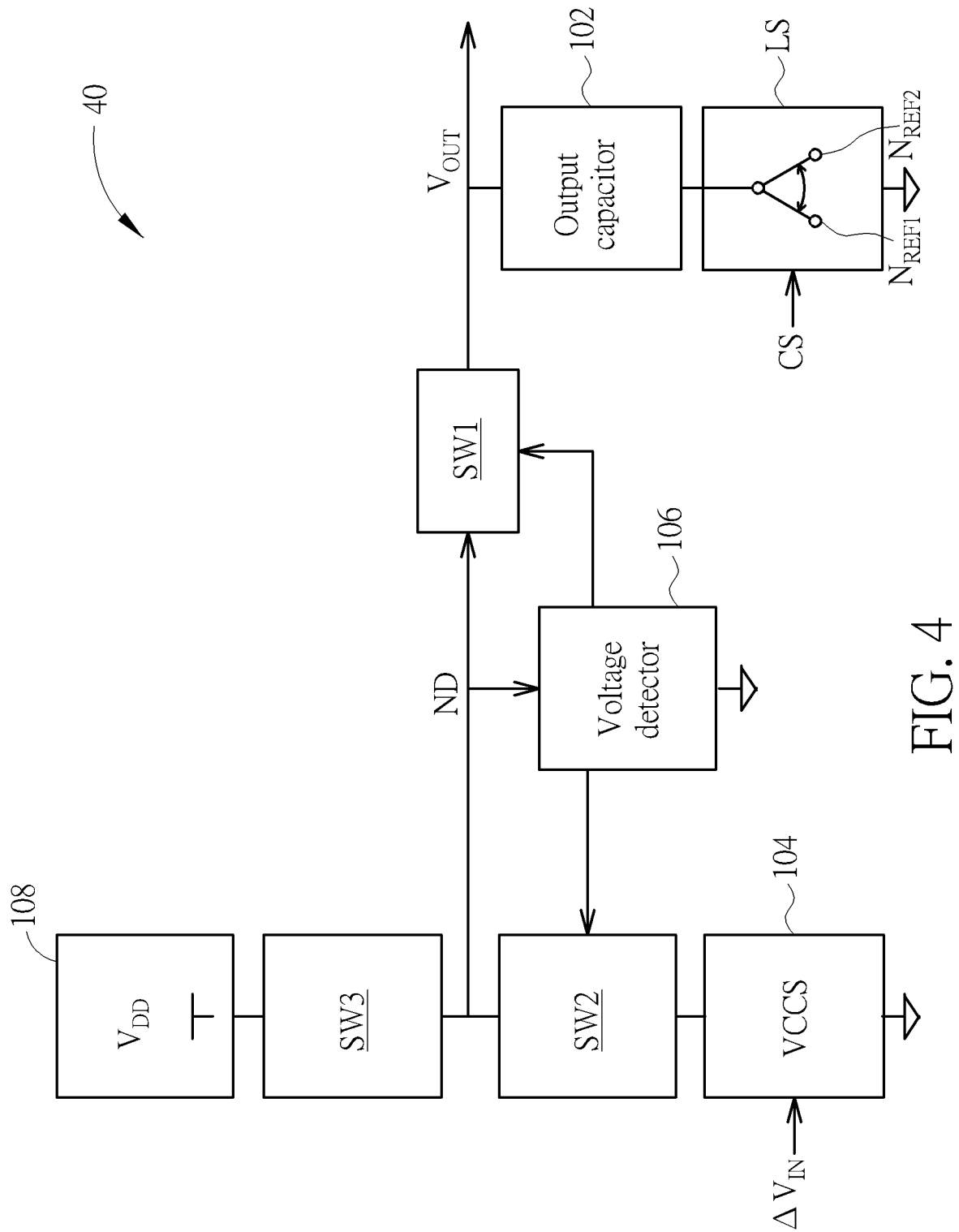
FIG. 4 is a schematic diagram of a dynamic amplifier according to an embodiment of the present invention.

In an embodiment as shown in FIG. 4, the level shifter LS includes a switch, which is controlled by the shift control signal CS to select to couple the output capacitor 102 to a reference voltage node $N_{REF1}$ or a reference voltage node $N_{REF2}$. The reference voltage nodes $N_{REF1}$ and $N_{REF2}$ provide different reference voltages; hence, when the switch changes its status to couple the output capacitor 102 to one reference voltage node from the other reference voltage node, the output voltage of the output capacitor 102 may be shifted to another level.

Figure 5:
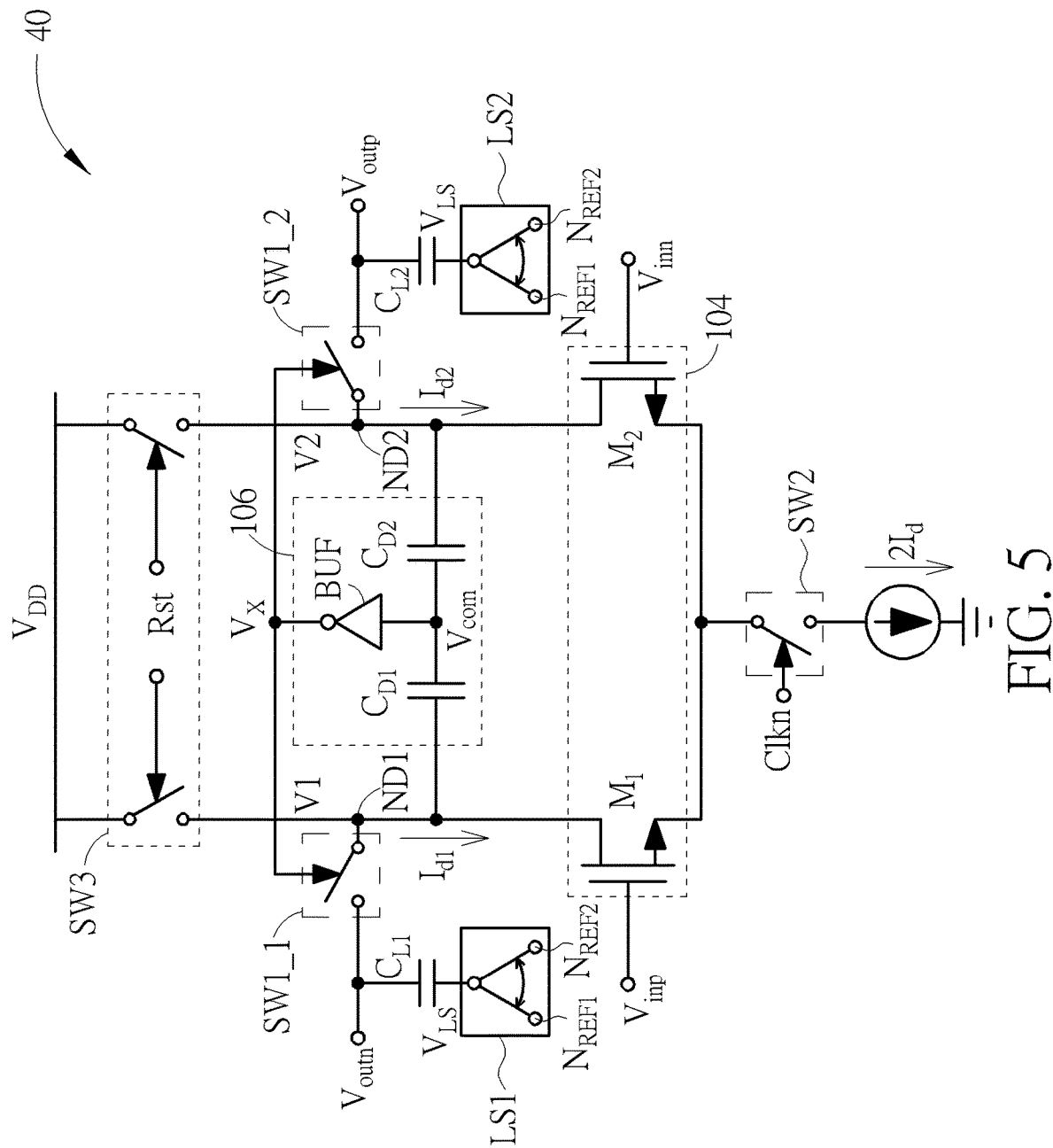
FIG. 5 illustrates an exemplary circuit structure of the dynamic amplifier shown in FIG. 4.

FIG. 5 illustrates an exemplary circuit structure of the dynamic amplifier 40 shown in FIG. 4. In the dynamic amplifier 10 shown FIG. 2, the upper terminal (e.g., the top plate) of the output capacitors $C_{L1}$ and $C_{L2}$ is coupled to the VCCS 104 via the switches SW1_1 and SW1_2, respectively, and the lower terminal (e.g., the bottom plate) of the output capacitors $C_{L1}$ and $C_{L2}$ is coupled to the ground terminal. In comparison, in the dynamic amplifier 40 shown in FIG. 5, the upper terminal of the output capacitors $C_{L1}$ and $C_{L2}$ is also coupled to the VCCS 104, while the lower terminal of the output capacitors $C_{L1}$ and $C_{L2}$ is coupled to level shifters LS1 and LS2, respectively.

Figure 6:
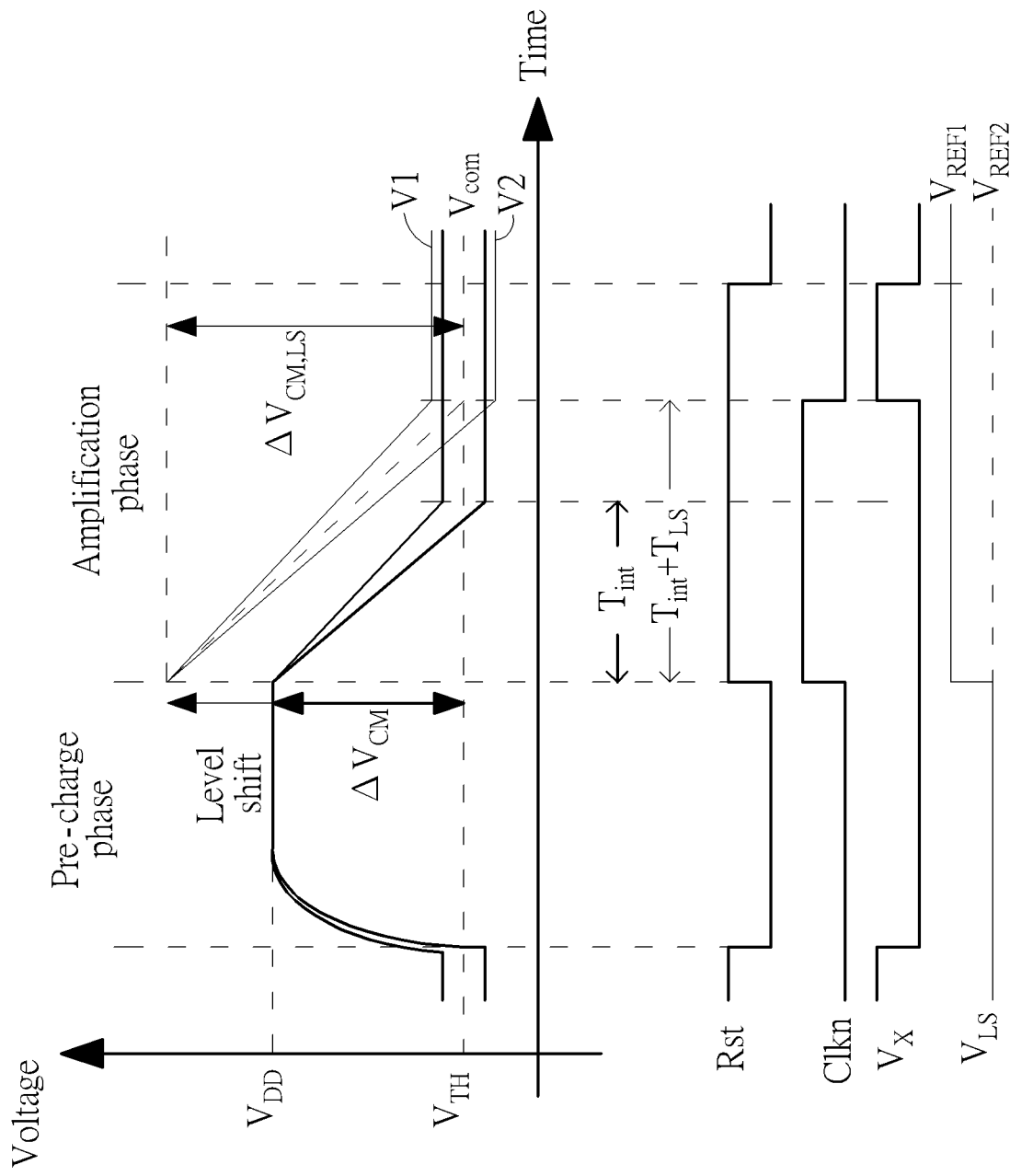
FIG. 6 illustrates detailed operations of the dynamic amplifier shown in FIG. 4.

FIG. 6 illustrates detailed operations of the dynamic amplifier 40. The operations also include a pre-charge phase and an amplification phase, as similar to those in FIG. 3. As shown in FIG. 6, at the end of the pre-charge phase, the voltage VS at the lower terminal of the output capacitors $C_{L1}$ and $C_{L2}$ rises to $V_{REF1}$ from $V_{REF2}$, which may be realized by the level shifters LS1 and LS2 controlling the lower terminal of the output capacitors $C_{L1}$ and $C_L$ originally coupled to the reference voltage node $N_{REF2}$ switched to be coupled to the reference voltage node $N_{REF1}$. Therefore, the voltages $V_{outn}$ and $V_{outp}$ at the upper terminal of the output capacitors $C_{L1}$ and $C_{L2}$ are shifted to a higher level. This results in that the value of the variation of output common-mode voltage $\Delta V_{CM}$ increases to $\Delta V_{CM,LS}$ equivalently, which thereby increases the gain of the dynamic amplifier 40. Similarly, the gain boosting method may also be considered as being realized with an increase in the integrating time of discharging the output capacitors (from $T_{int}$ to $T_{int}+T_L$s as shown in FIG. 6).

In an embodiment, the voltage detector 106 includes two detection capacitors $C_{D1}$ and $C_{D2}$ and a buffer BUF, as shown in FIG. 5. The detection capacitor $C_{D1}$ is coupled to the voltage detection node ND1, for detecting the output voltage $V_{outn}$ of the output capacitor $C_{L1}$ by receiving the voltage V1. The detection capacitor $C_{D2}$ is coupled to the voltage detection node ND2, for detecting the output voltage $V_{outp}$ of the output capacitor $C_{L2}$ by receiving the voltage V2. The detection capacitors $C_{D1}$ and $C_{D2}$ thereby obtain the common-mode voltage $V_{com}$ of the output voltages $V_{outn}$ and $V_{outp}$ at a common-mode detection node. The buffer BUF, which is coupled to the switches SW1_1 and SW1_2, may convert the received common-mode voltage $V_{com}$ into the control signal Vx, to control the switches SW1_1 and SW1_2 to be turned on or off according to the common-mode voltage $V_{com}$.

Please note that the level shifter of the present invention may be implemented in any manners or any types, such as capacitive type, resistive type or current type. In an embodiment, the level shifter may be implemented with an inverter structure, as the level shifter 70 shown in FIG. 7. The inverter structure, served as a switch controlling the coupling of the output capacitor, includes a PMOS transistor MP1 and an NMOS transistor MN1. The PMOS transistor MP1 is coupled between the output terminal of the level shifter 70 and the reference voltage node $N_{REF1}$. The NMOS transistor MN1 is coupled between the output terminal of the level shifter 70 and the reference voltage node $N_{REF2}$. The PMOS transistor MP1 and the NMOS transistor MN1 are controlled by the same shift control signal, to select to couple the output terminal to the reference voltage node $N_{REF1}$ or the reference voltage node $N_{REF2}$. In this embodiment, the reference voltage node $N_{REF1}$ may output the reference voltage $V_{REF1}$ equal to the power supply voltage or any other voltage greater than the reference voltage $V_{REF2}$, and the reference voltage node $N_{REF2}$ may output the reference voltage $V_{REF2}$ equal to the ground voltage or any other voltage smaller than the reference voltage $V_{REF1}$.

Figure 7:
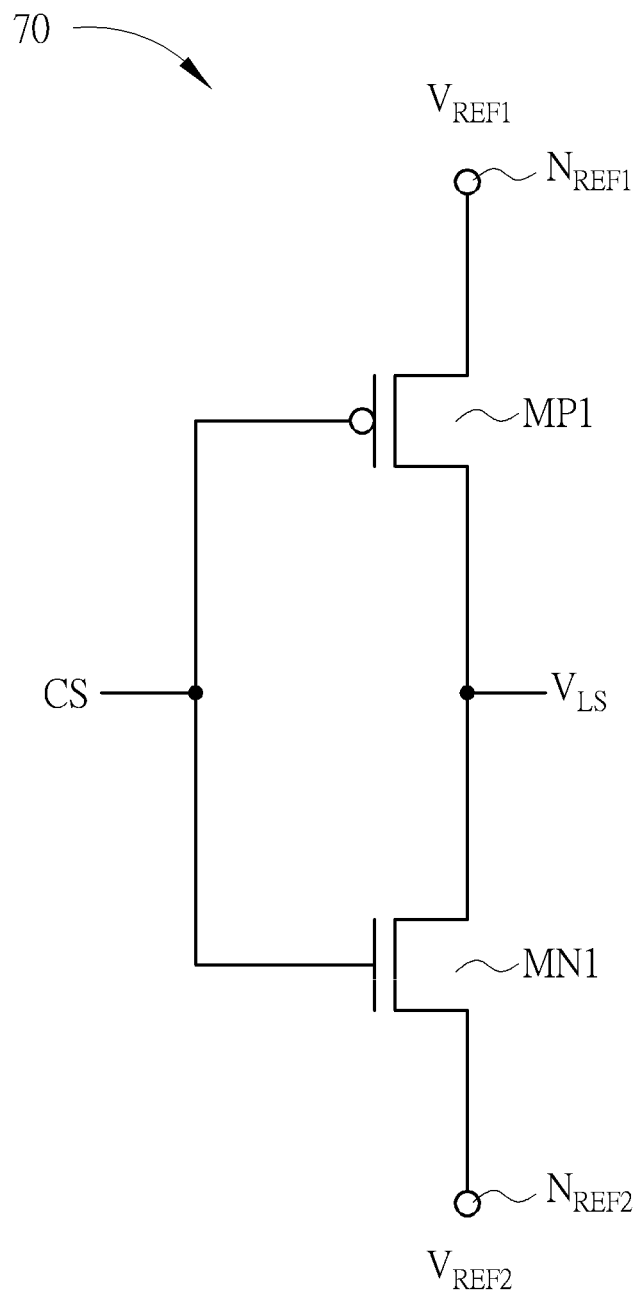
FIG. 7 is a schematic diagram of the level shifter according to an embodiment of the present invention.

As shown in FIG. 7, the shift control signal CS may be a logic signal generated from a digital control circuit, for example. If the shift control signal CS is "High", the NMOS transistor MN1 is turned on and the PMOS transistor MP1 is turned off, so that the level shifter 70 may output the reference voltage $V_{REF2}$ as the voltage $V_{LS}$ to the output capacitor. If the shift control signal CS is "Low", the PMOS transistor MP1 is turned on and the NMOS transistor MN1 is turned off, so that the level shifter 70 may output the reference voltage $V_{REF1}$ as the voltage $V_{LS}$ to the output capacitor. In such a situation, the level shifting method applied to the output capacitors of the dynamic amplifier may be realized by changing the status of the shift control signal CS.

In the dynamic amplifier 40 shown in FIG. 5, the level shifting method is realized by introducing a level shifter coupled to the lower terminal of the output capacitors which is originally coupled to the ground terminal in the dynamic amplifier 10 shown in FIG. 2. In this manner, the level shifting method may be realized without additional capacitors. In other embodiments, the level shifting method may be realized in other manners.

Figure 8:
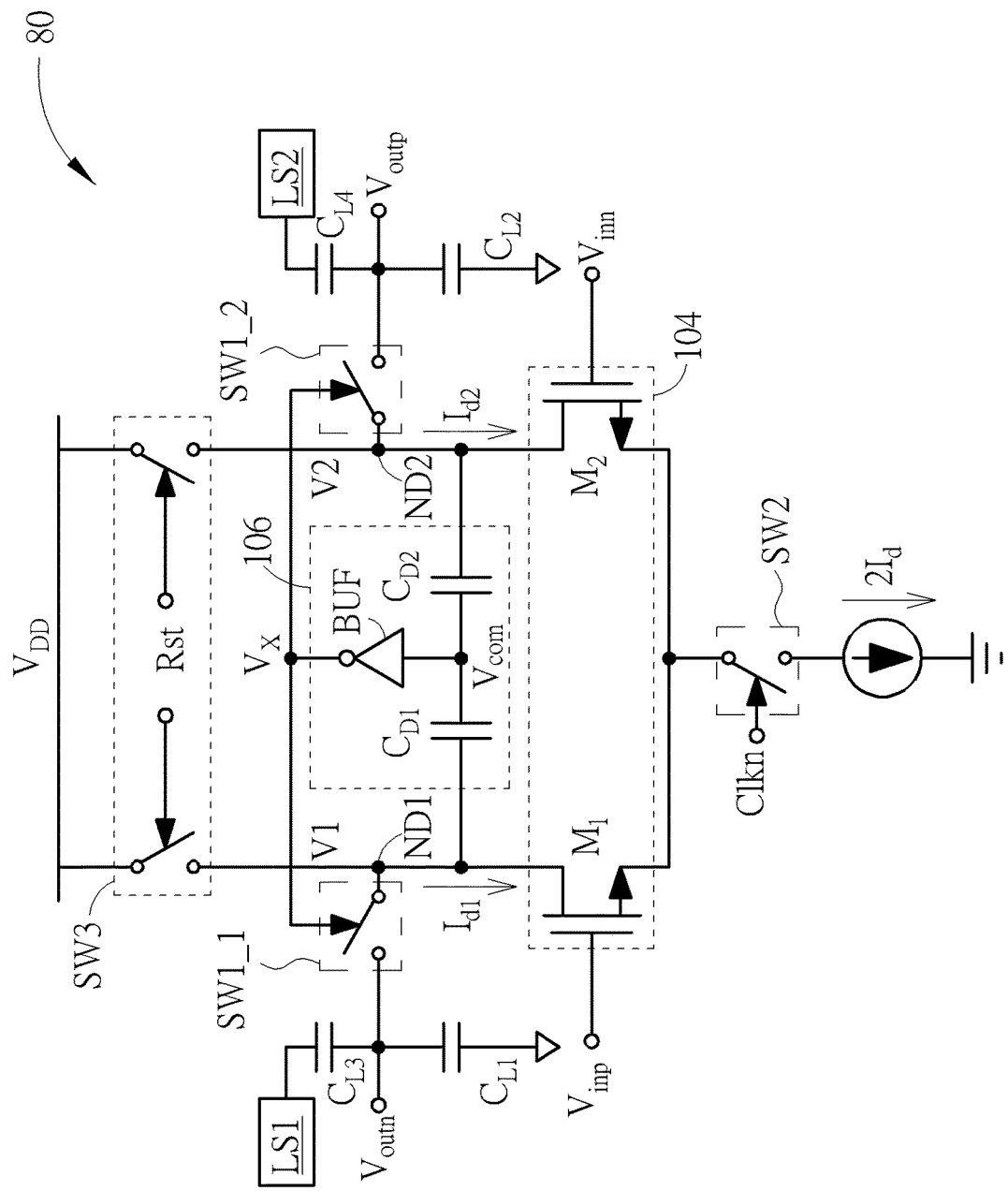
FIG. 8 is a schematic diagram of a dynamic amplifier according to an embodiment of the present invention.

Please refer to FIG. 8, which is a schematic diagram of a dynamic amplifier 80 according to an embodiment of the present invention. As shown in FIG. 8, the structure of the dynamic amplifier 80 is similar to the structure of the dynamic amplifier 10 shown in FIG. 2, so elements or modules having the same functions are denoted by the same symbols. The difference between the dynamic amplifier 80 and the dynamic amplifier 10 is that, the dynamic amplifier 80 further includes output capacitors $C_{L3}$ and $C_{L4}$ coupled to the differential output terminals of the dynamic amplifier 80, respectively. Another terminal of the output capacitors $C_{L3}$ and $C_{L4}$ is coupled to the level shifters LS1 and LS2, respectively. In such a situation, each output terminal of the dynamic amplifier 80 is coupled to two output transistors, one of which is further coupled to a level shifter, and the other is further coupled to the ground terminal. When the level shifter is switched to change its output voltage level, the output voltages of the dynamic amplifier 80 may also be shifted.

In the dynamic amplifier 80, the level shifting method may be considered as being realized by introducing additional output capacitors and corresponding level shifters in the general dynamic amplifier 10 shown in FIG. 2. Alternatively, the implementation of the dynamic amplifier 80 may be realized by dividing each output capacitor in the dynamic amplifier 10 into two parts, of which one part is further coupled to a level shifter and the other part is further coupled to the ground terminal.

Figure 9:
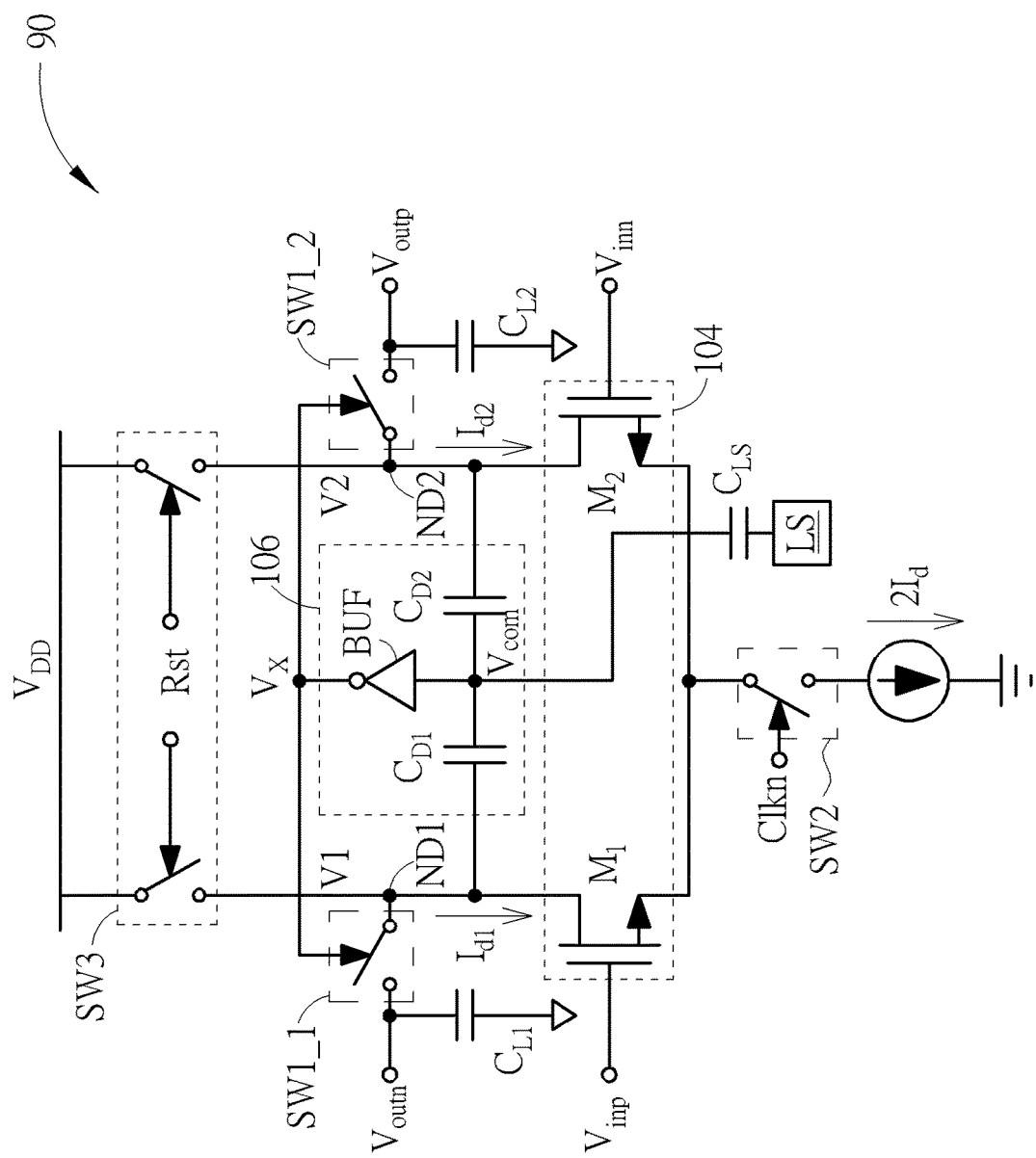
FIG. 9 is a schematic diagram of another dynamic amplifier according to an embodiment of the present invention.

Please refer to FIG. 9, which is a schematic diagram of another dynamic amplifier 90 according to an embodiment of the present invention. As shown in FIG. 9, the structure of the dynamic amplifier 90 is similar to the structure of the dynamic amplifier 40 shown in FIG. 5, so elements or modules having the same functions are denoted by the same symbols. The difference between the dynamic amplifier 90 and the dynamic amplifier 40 is that, in the dynamic amplifier 90 the level shifter is coupled to the voltage detector 106 rather than coupled to the output capacitors $C_{L1}$ and $C_{L2}$. As shown in FIG. 9, the dynamic amplifier 90 includes a coupling capacitor $C_{LS}$ and a level shifter LS. The level shifter LS may shift the common-mode voltage $V_{com}$ of the output voltages $V_{outn}$ and $V_{outp}$ at the common-mode detection node of the voltage detector 106; hence, the common-mode voltage $V_{com}$ may fall to the threshold $V_{TH}$ at a later time point, which increases the integrating time of amplification. As a result, the gain of the dynamic amplifier 90 may increase.

Please refer back to FIG. 5, where two level shifters are respectively coupled to the output capacitors $C_{L1}$ and $C_{L2}$ of the dynamic amplifier 40. If a mismatch exists between the output capacitors $C_{L1}$ and $C_{L2}$, the shifting quantities on the output voltages $V_{outn}$ and $V_{outp}$ may also have a mismatch. In comparison, as shown in FIG. 9, there is only one level shifter LS shifting the common-mode voltage $V_{com}$ of the output voltages $V_{outn}$ and $V_{outp}$, so the shifting quantities exerted on both output terminals will be identical, which solves the mismatch problem.

Please note that the present invention aims at providing a gain boosting method for a dynamic amplifier by shifting the level of an output voltage or an output common-mode voltage of the dynamic amplifier, to increase the variation of output common-mode voltage and also increase the integrating time of amplification. Those skilled in the art may make modifications and alternations accordingly. For example, in the above embodiments, the level shifter may change its status to shift the output voltages $V_{outn}$ and $V_{outp}$ to a higher level at the end of the pre-charge phase, as shown in FIG. 6. In another embodiment, the level shifting operation may be implemented at another time point. For example, in the dynamic amplifier 40, the level shifter LS may control the output capacitor originally coupled to the reference voltage node $N_{REF2}$ switched to be coupled to the reference voltage node $N_{REF1}$ to shift the level of the output voltage during the amplification phase.

Please further note that the gain boosting method of the present invention may be applied to any types of dynamic amplifiers. As long as the output signal of the dynamic amplifier is generated by charging or discharging the output capacitors via a current from a VCCS, the level shifter and gain boosting method of the present invention are applicable.

Figure 10:
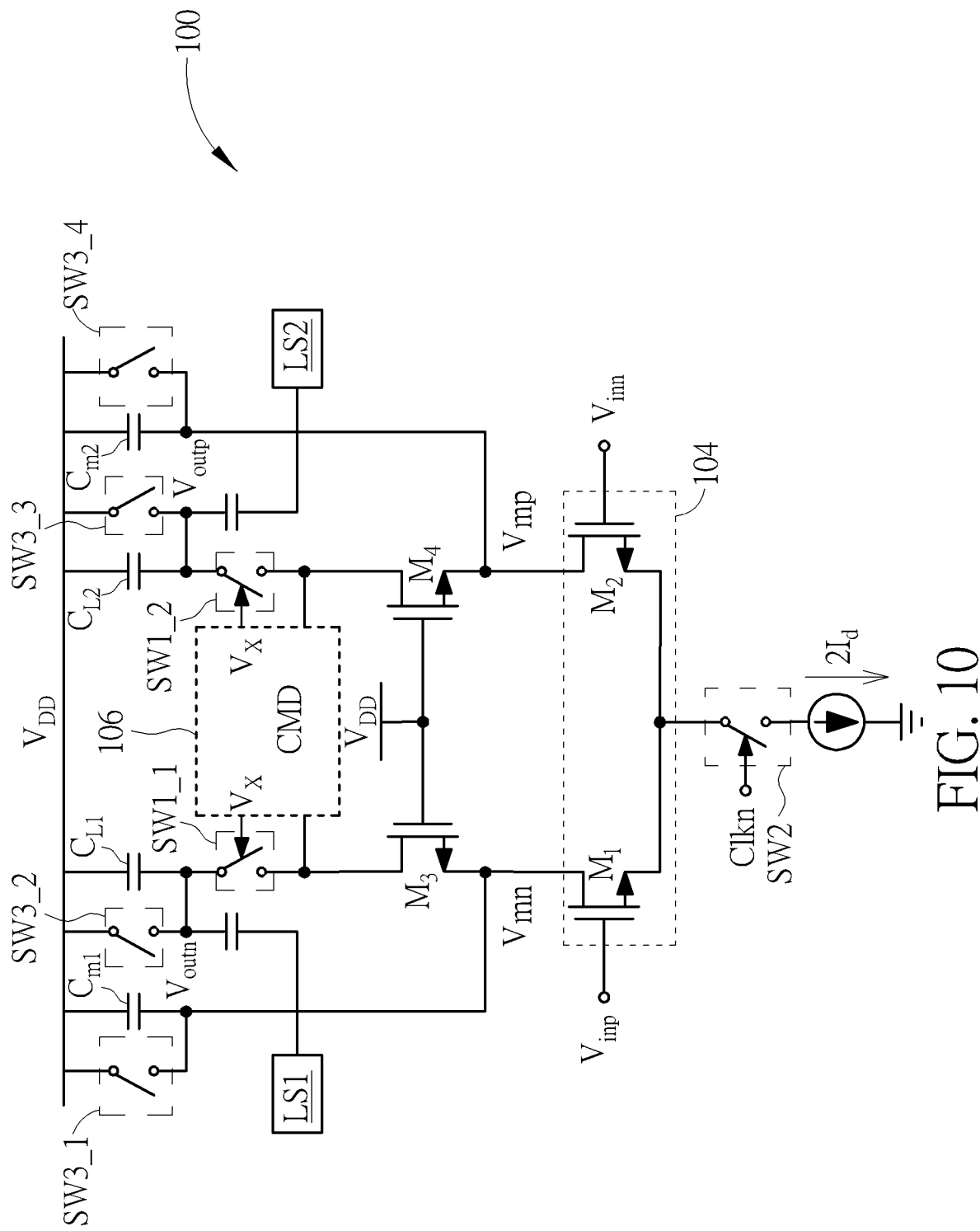
FIG. 10 is a schematic diagram of another dynamic amplifier according to an embodiment of the present invention.

Please refer to FIG. 10, which is a schematic diagram of another dynamic amplifier 100 according to an embodiment of the present invention. As shown in FIG. 10, the structure of the dynamic amplifier 100 is similar to the structure of the dynamic amplifier 40 shown in FIG. 5, so elements or modules having similar functions are denoted by similar symbols. The dynamic amplifier 100 and the dynamic amplifier 40 differ in that the dynamic amplifier 100 includes two additional transistors M3 and M4 served as a source follower. In addition to the output capacitors $C_{L1}$ and $C_{L2}$, the dynamic amplifier 100 further includes two capacitors $C_{m1}$ and $C_{m2}$ coupled to the source terminal of the transistors M3 and M4, respectively. The capacitors $C_{m1}$ and $C_{m2}$ are controlled by reset switches SW3_1 and SW3_4. By discharging the capacitors $C_{m1}$ and $C_{m2}$ and the output capacitors $C_{L1}$ and $C_{L2}$ in order, higher gain may be achieved.

Figure 11:
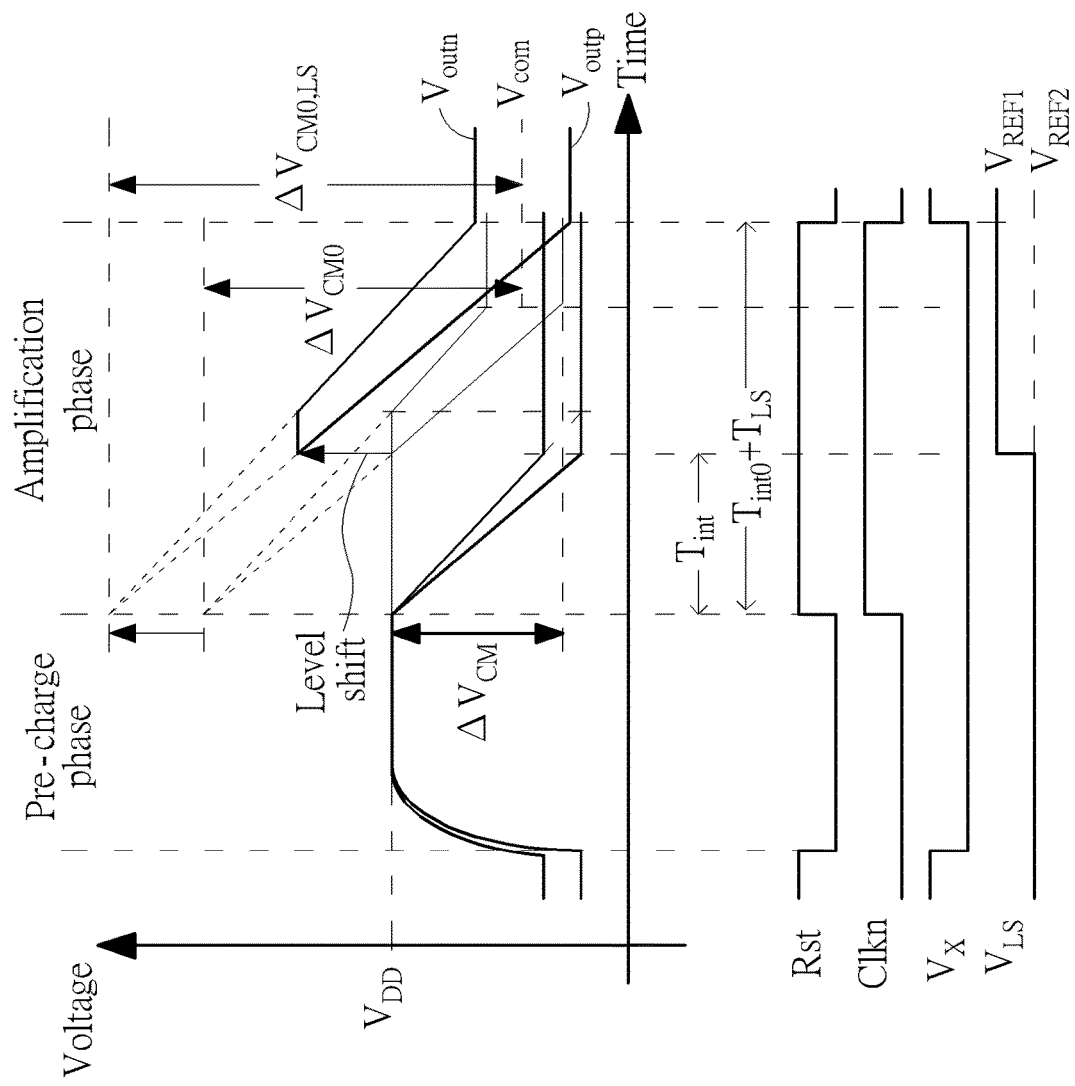
FIG. 11 illustrates detailed operations of the dynamic amplifier shown in FIG. 10.

FIG. 11 illustrates detailed operations of the dynamic amplifier 100. The operations also include a pre-charge phase and an amplification phase, as similar to those in FIG. 6. In the pre-charge phase, the voltages of the lower terminal of the capacitors $C_{m1}$, $C_{m2}$, $C_{L1}$ and $C_{L2}$ are reset to the power supply voltage $V_{DD}$. When the amplification phase starts, the discharge current of the VCCS 104 starts to discharge the capacitors $C_{m1}$ and $C_{m2}$. When the voltages $V_{mn}$ and $V_{mp}$ fall to a specific threshold (i.e., the power supply voltage $V_{DD}$ minus the threshold voltage of the transistors M3 and M4), the transistors M3 and M4 are turned on and the discharge current of the VCCS 104 starts to discharge the output capacitors $C_{L1}$ and $C_{L2}$. In this manner, the amplification phase includes two discharging periods, and thus the integrating time of amplification may increase. Also, the variation of output common-mode voltage $\Delta V_{CM}$ is regarded as extending to $\Delta V_{CM0}$ equivalently. The increasing variation of output common-mode voltage leads to increasing gain of the dynamic amplifier 100.

In addition, when the output capacitors $C_{L1}$ and $C_{L2}$ starts to be discharged, the level shifters LS1 and LS2 respectively shift the level of the output voltages $V_{outn}$ and $V_{outp}$ upwards, as shown in FIG. 11. This further extends the variation of output common-mode voltage to $\Delta V_{CM0,LS}$, and the integrating time also increases to $T_{in0}+T_{LS}$, so as to achieve the gain boosting effect. The detailed operations of the level shifters LS1 and LS2 shifting the level of the output voltages $V_{outn}$ and $V_{outp}$ are similar to the embodiments illustrated in FIGS. 4-6, and will not be narrated herein.

Figure 12:
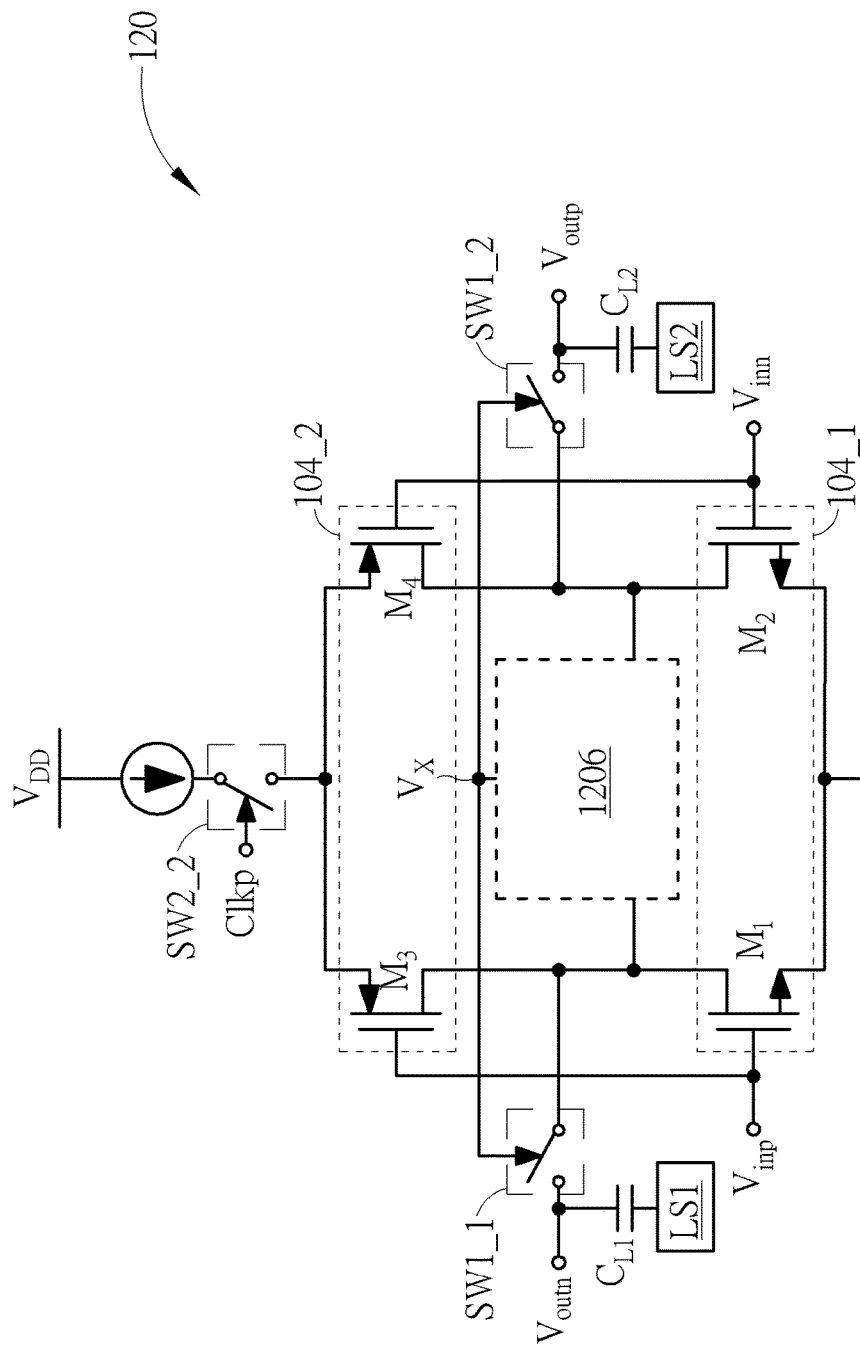
FIG. 12 is a schematic diagram of a further dynamic amplifier according to an embodiment of the present invention.

Please refer to FIG. 12, which is a schematic diagram of a further dynamic amplifier 120 according to an embodiment of the present invention. As shown in FIG. 12, the structure of the dynamic amplifier 120 is similar to the structure of the dynamic amplifier 40 shown in FIG. 5, so elements or modules having similar functions are denoted by similar symbols. The dynamic amplifier 120 and the dynamic amplifier 40 differ in that the dynamic amplifier 120 includes two VCCSs 104_1 and 104_2. The VCCS 104_1 is composed of two NMOS transistors M1 and M2 and the VCCS 104_2 is composed of two PMOS transistors M3 and M4. The voltage detector and pre-charge module 1206 provides functions of detecting the output voltages $V_{outn}$ and $V_{outp}$ in the amplification phase and resetting the output voltages $V_{outn}$ and $V_{outp}$ in the pre-charge phase.

Figure 13:
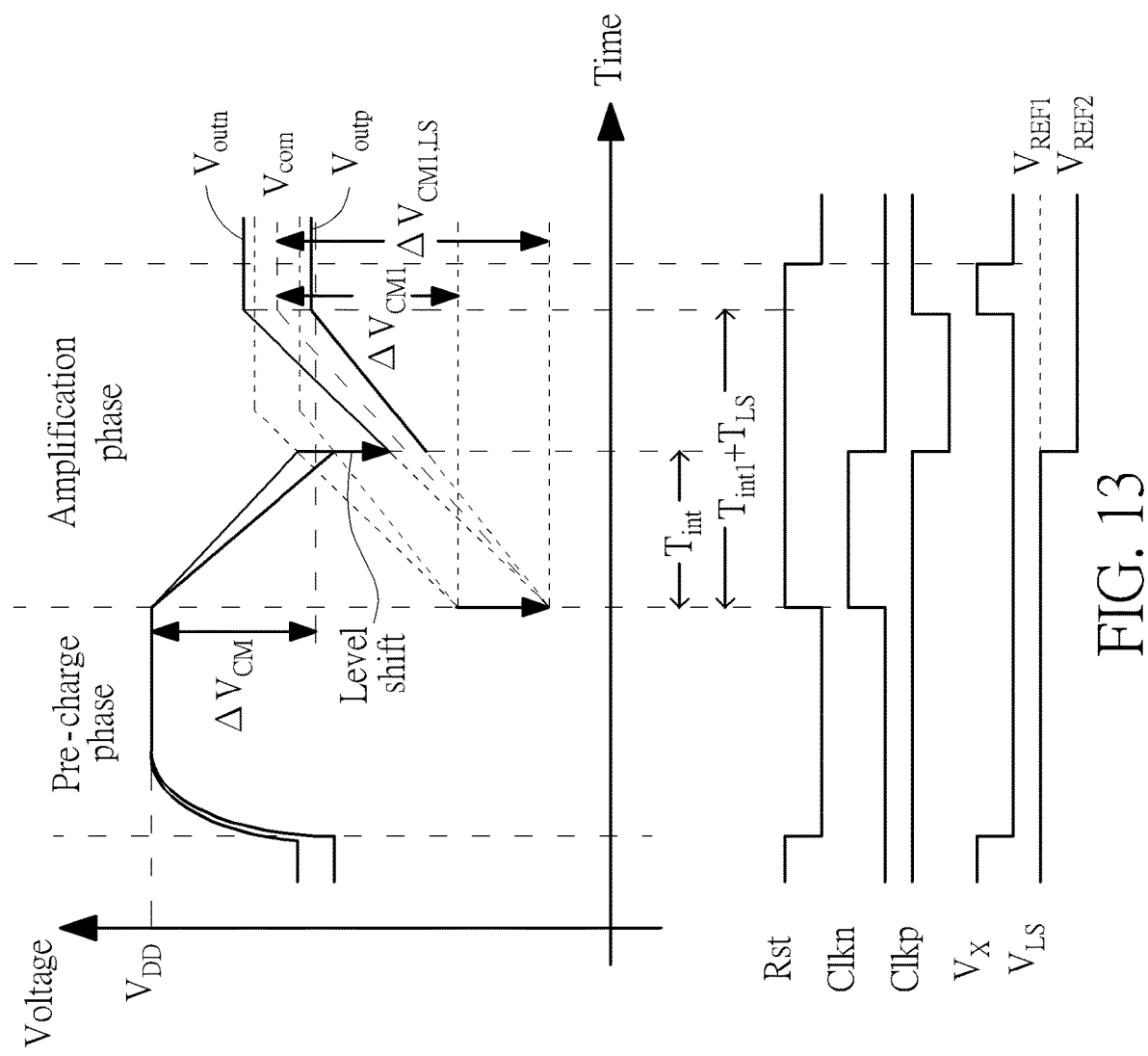
FIG. 13 illustrates detailed operations of the dynamic amplifier shown in FIG. 12.

FIG. 13 illustrates detailed operations of the dynamic amplifier 120. The operations also include a pre-charge phase and an amplification phase, as similar to those in FIG. 6. In the pre-charge phase, the voltages of the upper terminal of the capacitors $C_{L1}$ and $C_{L2}$ are reset to the power supply voltage $V_{DD}$. When the amplification phase starts, the discharge current of the VCCS 104_1 discharges the capacitors $C_{L1}$ and $C_{L2}$ and the output voltages $V_{outn}$ and $V_{outp}$ correspondingly fall. If the voltage detector and pre-charge module 1206 detects that the common-mode voltage $V_{com}$ of the output voltages $V_{outn}$ and $V_{outp}$ falls to a threshold, the NMOS transistors of the VCCS 104_1 are turned off by the switch SW2_1 and the PMOS transistors of the VCCS 104_2 are turned on by the switch SW2_2. The VCCS 104_2 then outputs a charge current to charge the output capacitors $C_{L1}$ and $C_{L2}$ and the output voltages $V_{outn}$ and $V_{outp}$ correspondingly rise. If the voltage detector and pre-charge module 1206 detects that the common-mode voltage $V_{com}$ of the output voltages $V_{outn}$ and $V_{outp}$ rises to another threshold, the voltage detector and pre-charge module 1206 may turn off the cutoff switches SW1_1 and SW1_2. In this embodiment, the voltage detector includes multiple thresholds for controlling the operations of the VCCSs 104_1 and 104_2 and the cutoff switches SW1_1 and SW1_2. The dynamic amplifier 120 is a bidirectional amplifier, where the amplification may be realized with both discharge currents from the NMOS VCCS 104_1 and charge currents from the PMOS VCCS 104_2. As can be seen, the amplification phase includes a discharging period and a charging period, and thus the integrating time of amplification may increase. Also, the variation of output common-mode voltage $\Delta V_{CM}$ is regarded as extending to $\Delta V_{CM1}$ equivalently. The increasing variation of output common-mode voltage leads to increasing gain of the dynamic amplifier 120.

In addition, at the end of the discharging operation and the start of the charging operation, the level shifters LS1 and LS2 respectively shift the level of the output voltages $V_{outn}$ and $V_{outp}$ downwards, as shown in FIG. 13. This further extends the variation of output common-mode voltage to $\Delta V_{CM1,LS}$, and the integrating time also increases to $T_{int1}+T_{LS}$, so as to achieve the gain boosting effect. Note that the level shifting operation is performed before the VCCS 104_2 charges the output capacitors $C_{L1}$ and $C_{L2}$; hence, the downward shift on the output voltages $V_{outn}$ and $V_{outp}$ may lead to a larger common-mode voltage variation and larger integrating time. In the above embodiments as shown in FIG. 6, the level shifting operation is an upward shift performed before the VCCS discharges the output capacitors $C_{L1}$ and $C_{L2}$, so as to increase the common-mode voltage variation and the integrating time.

In another embodiment, the level shifting operation may be performed by multiple times, to further boost the gain of the dynamic amplifier. For example, in the dynamic amplifier 120 shown in FIG. 12, the level shifters LS1 and LS2 may shift the output voltages $V_{outn}$ and $V_{out}$ upwards before the VCCS 104_1 outputs the discharge currents to discharge the output capacitors $C_{L1}$ and $C_{L2}$ (i.e., at the end of the pre-charge phase), and then shift the output voltages $V_{outn}$ and $V_{outp}$ downwards before the VCCS 104_2 outputs the charge currents to charge the output capacitors $C_{L1}$ and $C_{L2}$. TO achieve this purpose, the level shifters LS1 and LS2 may control the lower terminal of the output capacitors $C_{L1}$ and $C_{L2}$ which originally coupled to a first reference voltage node to receive a lower reference voltage switched to be coupled to a second reference voltage node to receive a higher reference voltage, and then switched back to be coupled to the first reference voltage node to receive the lower reference voltage. Furthermore, during the amplification phase, the discharging operation and charging operation may be performed alternately by multiple times; hence, the level shifting operations (with upward shift and downward shift in turn) may be correspondingly performed, to unlimitedly increase the gain of the dynamic amplifier 120.

In comparison with the dynamic amplifier 100 shown in FIG. 10, the dynamic amplifier 120 further achieves the benefit of fewer capacitor numbers, which leads to lower circuit costs. There are fewer number of capacitors needing to be pre-charged in each pre-charge phase, and thus less power is consumed accordingly. Moreover, in the dynamic amplifier 120, the VCCS 104_2 charges the output capacitors $C_{L1}$ and $C_{L2}$ during the amplification phase and the charging operation pushes the output voltages $V_{outn}$ and $V_{outp}$ to a level closer to the power supply voltage $V_{DD}$; hence, in the next pre-charge phase, the power required for pre-charging the output capacitors $C_{L1}$ and $C_{L2}$ may be saved.

Please note that the deployments of level shifters shown in FIGS. 8 and 9 are also applicable to the dynamic amplifiers 100 and 120. That is, parts of the output capacitors are coupled to the level shifters and other output capacitors are coupled to the ground terminal; and/or a level shifter is coupled to the common-mode detection node of the voltage detector.

Figure 14:
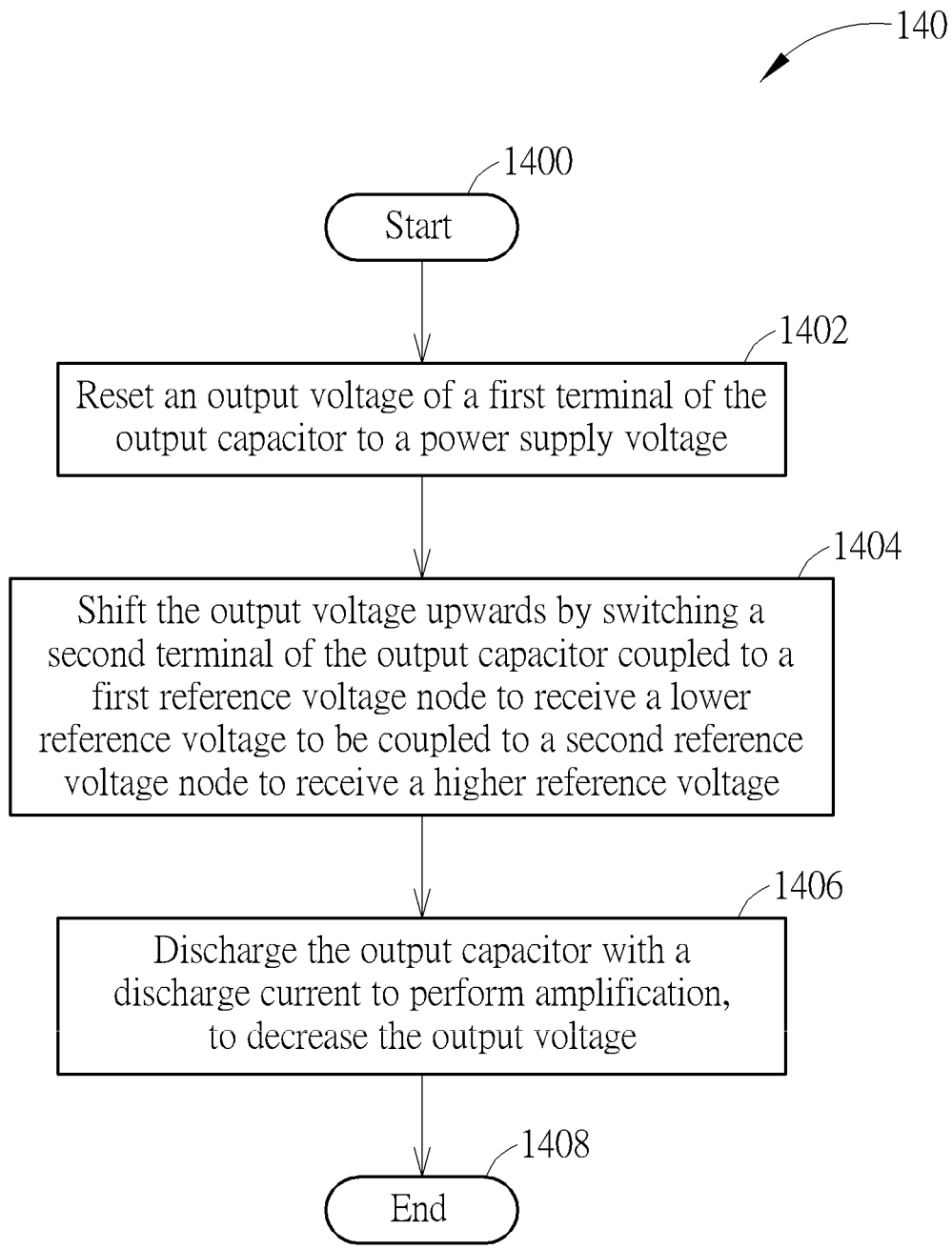
FIG. 14 is a schematic diagram of a gain boosting process according to an embodiment of the present invention.

The abovementioned gain boosting operations of the present invention may be summarized into a gain boosting process 140, as shown in FIG. 14. The gain boosting process 140 may be applied to any of the dynamic amplifiers 40, 80, 90, 100 and 120, and includes the following steps:

Step 1400: Start.

Step 1402: Reset an output voltage of a first terminal of the output capacitor to a power supply voltage.

Step 1404: Shift the output voltage upwards by switching a second terminal of the output capacitor coupled to a first reference voltage node to receive a lower reference voltage to be coupled to a second reference voltage node to receive a higher reference voltage.

Step 1406: Discharge the output capacitor with a discharge current to perform amplification, to decrease the output voltage.

Step 1408: End.

Figure 15:
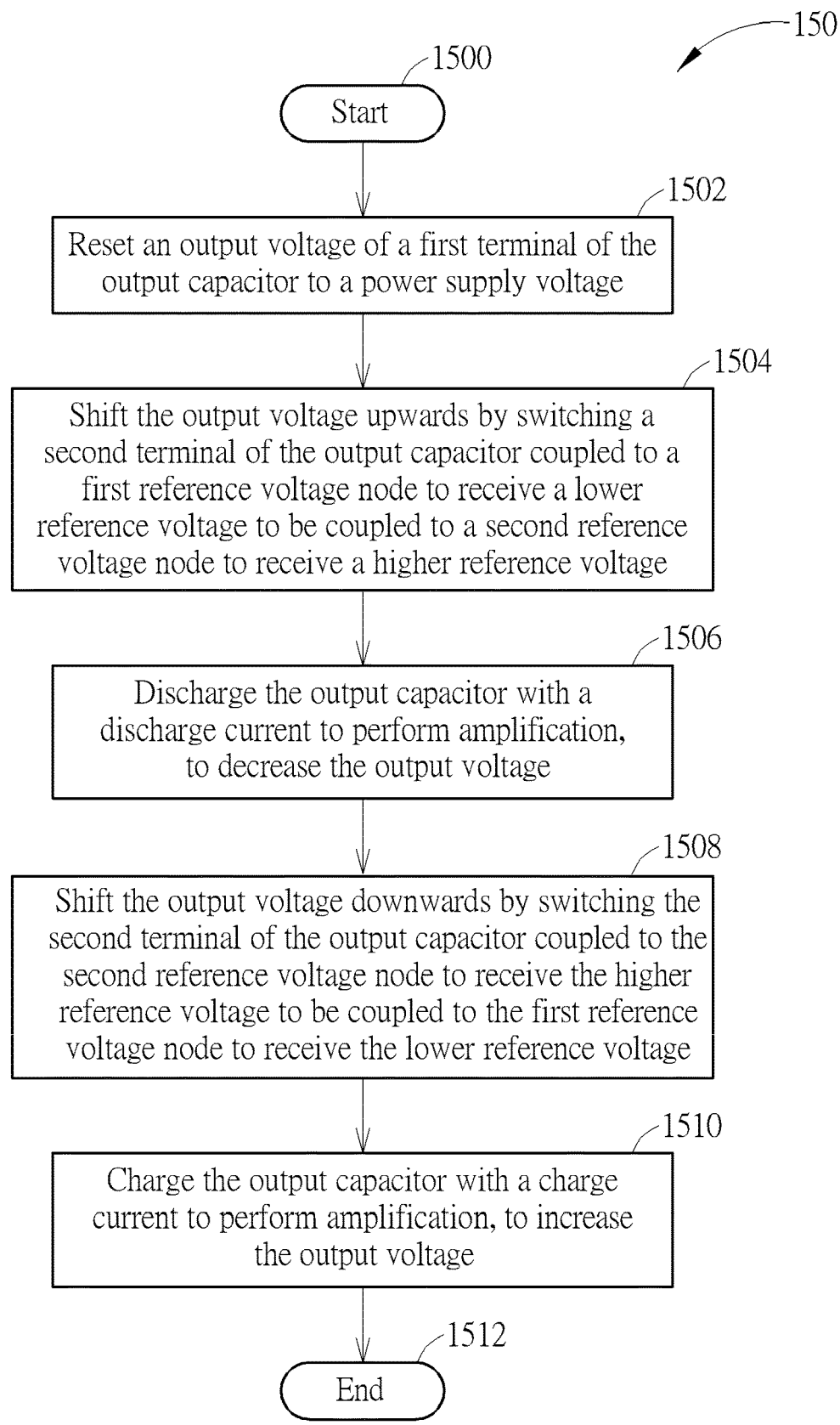
FIG. 15 is a schematic diagram of a gain boosting process according to an embodiment of the present invention.

The detailed operations and alternations of the gain boosting process 140 are described in the above paragraphs, and will not be narrated herein. Note that the gain boosting process 140 realizes gain boosting by shifting the output voltage upwards; while in another embodiment, gain boosting may further be realized by shifting the output voltage downwards, and this is applicable to the dynamic amplifier 120. As shown in FIG. 15, a gain boosting process 150, which realizes gain boosting by shifting the output voltage upwards and downwards, includes the following steps:

Step 1500: Start.

Step 1502: Reset an output voltage of a first terminal of the output capacitor to a power supply voltage.

Step 1504: Shift the output voltage upwards by switching a second terminal of the output capacitor coupled to a first reference voltage node to receive a lower reference voltage to be coupled to a second reference voltage node to receive a higher reference voltage.

Step 1506: Discharge the output capacitor with a discharge current to perform amplification, to decrease the output voltage.

Step 1508: Shift the output voltage downwards by switching the second terminal of the output capacitor coupled to the second reference voltage node to receive the higher reference voltage to be coupled to the first reference voltage node to receive the lower reference voltage.

Step 1510: Charge the output capacitor with a charge current to perform amplification, to increase the output voltage.

Step 1512: End.

Please note that the steps 1504-1510 may be performed repeatedly to unlimitedly boost the gain. Other detailed operations and alternations of the gain boosting process 150 are described in the above paragraphs, and will not be narrated herein.

To sum up, the embodiments of the present invention provide a gain boosting method for a dynamic amplifier by shifting the level of an output voltage or an output common-mode voltage of the dynamic amplifier, to increase the variation of output common-mode voltage and also increase the integrating time of amplification. A level shifter having a switch is coupled to the output capacitor or voltage detector to realize the gain boosting method. The gain boosting method of shifting the voltage level may be performed at the end of the pre-charge phase or during the amplification phase, and may be performed by one or more times according to system requirements. The gain boosting method of the present invention may be applied to any types of dynamic amplifiers having any structures, which should not be limited to the embodiments illustrated in this disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic amplifier, comprising:
a first output capacitor;
a first switch, coupled between a first terminal of the first output capacitor and a voltage detection node;
a current source;
a second switch, coupled to the current source and the voltage detection node;
a voltage detector, coupled to the voltage detection node and the first switch;
a third switch, coupled between the voltage detection node and a power source; and
a level shifter, coupled to a second terminal of the first output capacitor.

2. The dynamic amplifier of claim 1, wherein the voltage detector is configured for detecting an output voltage of the first terminal of the first output capacitor via the voltage detection node.

3. The dynamic amplifier of claim 1, further comprising a second output capacitor, and the voltage detector comprising:
a first detection capacitor, coupled to the voltage detection node;
a second detection capacitor, coupled to another voltage detection node for detecting the second output capacitor; and
a buffer, coupled to the first switch, for controlling the first switch to be turned on or off according to a common-mode voltage of the first output capacitor and the second output capacitor.

4. The dynamic amplifier of claim 1, wherein the level shifter comprises a switch, selectively couple the second terminal of the first output capacitor to a first reference voltage node or a second reference voltage node.

5. The dynamic amplifier of claim 4, wherein the switch of the level shifter comprises:
a PMOS transistor, coupled between the second terminal of the first output capacitor and the first reference voltage node; and
an NMOS transistor, coupled between the second terminal of the first output capacitor and the second reference voltage node;

wherein the PMOS transistor and the NMOS transistor are controlled by a same control signal to selectively couple the second terminal of the first output capacitor to the first reference voltage node or the second reference voltage node.

6. The dynamic amplifier of claim 1, wherein in a pre-charge phase, the first switch and the third switch are turned on, to reset an output voltage of the first terminal of the first output capacitor to a power supply voltage of the power source.

7. The dynamic amplifier of claim 6, wherein the level shifter controls the second terminal of the first output capacitor coupled to a first reference voltage node switched to be coupled to a second reference voltage node at the end of the pre-charge phase.

8. The dynamic amplifier of claim 7, wherein in an amplification phase, the first switch and the second switch are turned on, allowing the current source to charge or discharge the output capacitor with a charge or discharge current, to perform amplification.

9. The dynamic amplifier of claim 8, wherein the voltage detector controls the first switch to be turned off when detecting that a common-mode voltage of output voltages of the first output capacitor and a second output capacitor reaches a threshold.

10. The dynamic amplifier of claim 8, wherein the level shifter controls the second terminal of the first output capacitor coupled to a first reference voltage node switched to be coupled to a second reference voltage node during the amplification phase.

11. The dynamic amplifier of claim 8, wherein the level shifter controls coupling of the second terminal of the first output capacitor to be switched by multiple times in the amplification phase.

12. The dynamic amplifier of claim 1, further comprising a second output capacitor, wherein an output terminal of the dynamic amplifier is coupled to the first terminal of the first output capacitor and a first terminal of the second output capacitor, and a second terminal of the second output capacitor is coupled to a ground terminal.

13. The dynamic amplifier of claim 1, wherein the level shifter shifts an output voltage of the first terminal of the first output capacitor upwards before the current source discharges the first output capacitor to perform amplification.

14. The dynamic amplifier of claim 1, wherein the level shifter shifts an output voltage of the first terminal of the first output capacitor downwards before the current source charges the first output capacitor to perform amplification.

15. A dynamic amplifier, comprising:
a first output capacitor;
a second output capacitor;
a first cutoff switch, coupled between the first output capacitor and a first voltage detection node;
a second cutoff switch, coupled between the second output capacitor and a second voltage detection node;
a current source;
an amplification control switch, coupled to the current source, the first voltage detection node and the second voltage detection node;
a voltage detector, coupled to the first voltage detection node, the second voltage detection node, the first cutoff switch and the second cutoff switch;
a first reset switch, coupled between the first voltage detection node and a power source;
a second reset switch, coupled between the second voltage detection node and the power source;
a coupling capacitor; and a level shifter, coupled to the voltage detector via the coupling capacitor.

16. The dynamic amplifier of claim 15, wherein the voltage detector comprises:
- a first detection capacitor, coupled between the first voltage detection node and a common-mode detection node of the voltage detector;
- a second detection capacitor, coupled between the second voltage detection node and the common-mode detection node; and
- a buffer, coupled to the first cutoff switch and the second cutoff switch, for controlling the first switch and the second cutoff switch to be turned on or off according to a common-mode voltage on the common-mode detection node.

17. A gain boosting method for a dynamic amplifier, comprising:
- resetting an output voltage of a first terminal of an output capacitor to a power supply voltage;
- charging or discharging the output capacitor with a charge or discharge current to perform amplification, to increase or decrease the output voltage; and
- shifting the output voltage by switching a second terminal of the output capacitor coupled to a first reference voltage node to be coupled to a second reference voltage node.

18. The gain boosting method of claim 17, wherein the step of shifting the output voltage is performed at the end of the step of resetting the output voltage to the power supply voltage.

19. The gain boosting method of claim 17, wherein the step of shifting the output voltage is performed during the step of charging or discharging the output capacitor to perform amplification.

* * * * *